United States Patent
Kazama et al.

(10) Patent No.: US 12,341,506 B2
(45) Date of Patent: Jun. 24, 2025

(54) HIGH-SIDE TRANSISTOR PARTITIONING AND CONTROL

(71) Applicant: TEXAS INSTRUMENTS INCORPORATED, Dallas, TX (US)

(72) Inventors: Taisuke Kazama, Plano, TX (US); Mustapha El-Markhi, Richardson, TX (US); Indumini W Ranmuthu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/326,613

(22) Filed: May 31, 2023

(65) Prior Publication Data

US 2024/0405773 A1    Dec. 5, 2024

(51) Int. Cl.
*H03K 17/693* (2006.01)
*H03K 5/133* (2014.01)
*H03K 19/00* (2006.01)
*H03K 19/003* (2006.01)

(52) U.S. Cl.
CPC .......... *H03K 17/693* (2013.01); *H03K 5/133* (2013.01); *H03K 19/0013* (2013.01); *H03K 19/00315* (2013.01)

(58) Field of Classification Search
CPC .......... H02M 1/08; H02M 1/38; H02M 3/158; H02M 3/1588; H02M 1/0054; H02M 1/0006; H02M 1/0058; H02M 1/44; H02M 7/5387; H02M 1/0051; H02M 1/088; H02M 1/32; H02M 1/36; H02M 3/155; H02M 3/156; H02M 7/537; H03K 2217/0063; H03K 2217/0072; H03K 2217/0036; H03K 17/162; H03K 17/6871; H03K 17/164; H03K 17/687; H03K 17/04123; H03K 17/0822; H03K 17/165; H03K 2217/0081; H03K 17/166; H03K 17/284; H03K 17/567; H03K 5/1515; H03K 17/063; H03K 17/691; H03K 19/00361; H03K 19/018521; H03K 2005/00078; H01L 29/407; H01L 2224/48137; H01L 2224/49171; H01L 27/088; H01L 29/2003; H01L 29/7813; H01L 2924/00
See application file for complete search history.

(56) References Cited

U.S. PATENT DOCUMENTS

| | | | | |
|---|---|---|---|---|
| 2013/0264654 | A1* | 10/2013 | Weis | H03K 17/102 257/E27.026 |
| 2017/0338731 | A1* | 11/2017 | Zuniga | H02M 1/38 |
| 2022/0393594 | A1* | 12/2022 | Han | H02M 3/157 |

* cited by examiner

*Primary Examiner* — Lincoln D Donovan
*Assistant Examiner* — Tyler J Pereny
(74) *Attorney, Agent, or Firm* — Valerie M. Davis; Frank D. Cimino

(57) ABSTRACT

A circuit includes a transistor, a first driver, a second driver, and a delay circuit. The transistor includes an array of transistor cells partitioned into a first switch and a second switch. The first driver is configured to control the first switch. The second driver is configured to control the second switch. The delay circuit is coupled between the first driver and the second driver. The delay circuit is configured to delay closure of the second switch until the first switch is closed and a voltage across the first switch is less than a predetermined voltage.

19 Claims, 7 Drawing Sheets

HIGH-SIDE TRANSISTOR PARTITIONING AND CONTROL

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

Some switch-mode power supply topologies include a drive/power transistor (a switch) coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. Switch-mode power supplies are widely used to power electronic devices, particularly battery powered devices, such as portable cellular phones, laptop computers, and other electronic systems in which efficient use of power is desirable.

Because the power transistor's control terminal may present significant capacitance, a gate driver circuit may be employed to buffer an input signal and drive the power transistor's control terminal. The gate driver circuit receives a low-power input signal and buffers the input signal to produce a high-current signal that quickly charges or discharges the input capacitance of the power transistor. Examples of power transistors with which a gate driver circuit may be employed include insulated gate bipolar transistors and metal oxide semiconductor field-effect-transistors.

SUMMARY

In one example, a circuit includes a transistor, a first driver, a second driver, and a delay circuit. The transistor includes an array of transistor cells partitioned into a first switch and a second switch. The first switch has a first control input, and the second switch has a second control input. The first driver has a first driver input and a first driver output. The first driver output is coupled to the first control input. The second driver has a second driver input and second driver output. The second driver output is coupled to the second control input. The delay circuit is coupled between the first driver input and the second driver input.

In another example, a circuit includes a transistor, a first driver, a second driver, and a delay circuit. The transistor includes an array of transistor cells partitioned into a first switch and a second switch. The first driver is configured to control the first switch. The second driver is configured to control the second switch. The delay circuit is coupled between the first driver and the second driver. The delay circuit is configured to delay closure of the second switch until the first switch is closed and a voltage across the first switch is less than a predetermined voltage.

In a further example, a switching converter includes a high-side transistor, a low-side transistor, a first driver, a second driver, a third driver, and a delay circuit. The high-side transistor includes an array of transistor cells partitioned into a first switch and a second switch. The first switch has a first control input and a first current terminal, and the second switch has a second control input and a second current terminal. The low-side transistor includes a third control input, and a third current terminal coupled to the first current terminal and the second current terminal. The first driver has a first driver input and a first driver output. The first driver output is coupled to the first control input. The second driver has a second driver input and second driver output. The second driver output is coupled to the second control input. The third driver has a third driver output coupled to the third control input. The delay circuit is coupled between the first driver input and the second driver input.

DETAILED DESCRIPTION

Transistor driver circuits may be designed to provide fast transistor turn-on in order to reduce overlap switching losses and improve peak efficiency. To provide fast turn-on of the high-side transistor in a switching converter, the driver circuit may provide strong pull up to charge the gate-to-drain capacitance (Cgd) of the high-side transistor. Providing strong pull-up draws a relatively large transient current through the parasitic inductor coupled to the power terminal of the driver circuit. Because the current through the parasitic inductor cannot change instantaneously, the voltage provided to the driver circuit drops. With the power supply voltage reduced, the driver circuit cannot fully turn on the high-side transistor. Accordingly, the slew rate of the voltage across the high-side transistor (Vds) is limited, overlap switching loss increases, and efficiency decreases.

The power stage circuits described herein provide improved efficiency by reducing the transient current needed to charge the gate-to-drain capacitance of the high-side transistor. The capacitance is reduced by partitioning the high-side transistor in two switches, each having a reduced gate-to-drain capacitance relative to a single switch. The number of transistor cells allocated to the first and second switch may be selected to optimize efficiency. Closing of the two switches is sequenced to provide a high rate of voltage change across the high-side transistor. The first switch is initially closed with a strong pull-up, and thereafter the second switch is closed. The pull-up provided to the second switch may be weaker than the pull-up provided to the first switch.

Figure 1:
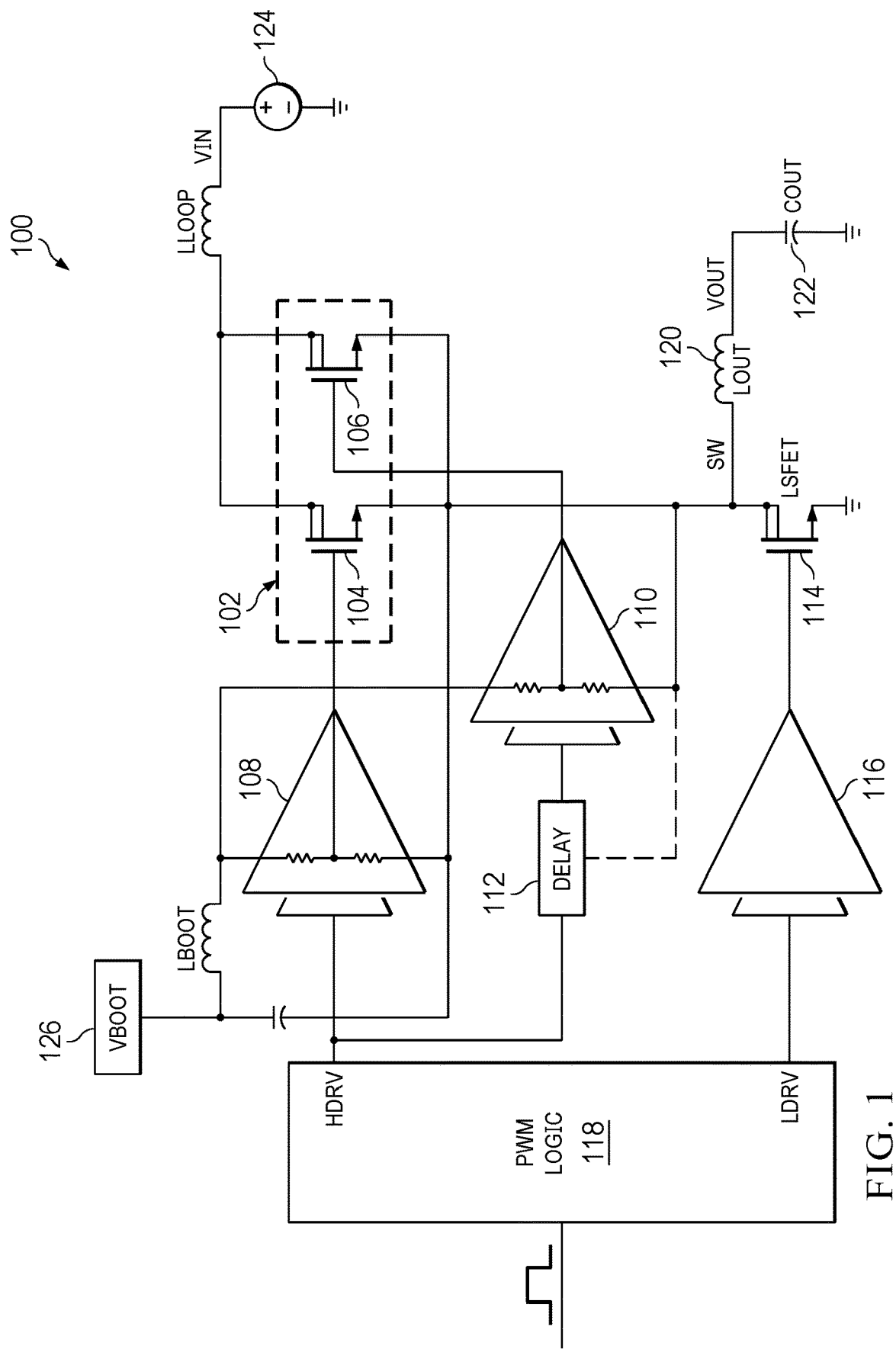
FIG. 1 is a block diagram of a power stage circuit that includes transistor partitioning and sequencing as described herein, in an example.

FIG. 1 is a block diagram of a power stage circuit 100. The power stage circuit 100 includes a high-side transistor 102, a high-side driver 108, a high-side driver 110, a delay circuit 112, a low-side transistor 114, and a low-side driver 116. The high-side transistor 102 may be an n-channel field effect transistor (NFET). The high-side transistor 102 includes a first current terminal coupled to a voltage source 124 (e.g., a battery). A parasitic inductance (Lloop) is formed between the high-side transistor 102 and the voltage source 124 by the various conductors coupling the high-side transistor 102 to the voltage source 124. A second current terminal of the high-side transistor 102 is coupled to the low-side transistor 114 at a switch node (SW). The switch node is coupled to an inductor 120. The inductor 120 is coupled to an output capacitor 122.

The low-side transistor 114 is coupled between the switch node and a ground terminal. The low-side driver 116 is coupled between the low-side transistor 114 and a pulse width modulation (PWM) circuit 118. The PWM circuit 118 generates the pulses that turn the high-side transistor 102 and the low-side transistor 114 on and off to charge and discharge the inductor 120. The low-side transistor 114 may be an NFET.

The high-side transistor 102 is partitioned into switch 104 and switch 106. For example, a selected portion of the transistor cells of the high-side transistor 102 are allocated to the switch 104, and the transistors cells of the high-side transistor 102 that are not allocated to the switch 104 are allocated to the switch 106. The high-side driver 108 is coupled between a control input (e.g., gate) of the high-side transistor 102 and an output of the PWM circuit 118. The high-side driver 108 buffers and level translates a high-side control signal (HDRV) received from the PWM circuit 118 to control the switch 104.

The control input of the switch 106 is coupled to an output of the high-side driver 110. The delay circuit 112 is coupled between an input of the high-side driver 110 and the input of the high-side driver 108. The delay circuit 112 delays HDRV to the high-side driver 110 such that the high-side driver 110 closes the switch 106 after the high-side driver 108 has closed the switch 104 and the voltage across the high-side transistor 102 is less than a predetermined voltage. For example, the delay circuit 112 may delay HDRV to the high-side driver 110 until the voltage at the switch node is within a predetermined voltage (e.g., a few millivolts) of VIN.

The high-side driver 108 and the high-side driver 110 are powered by a boot voltage circuit 126, such as a charge pump, which generates a voltage that is greater than VIN (e.g., 5 volts above VIN). A parasitic inductance LBOOT is formed by the various conductors that couple the boot voltage circuit 126 to the high-side driver 108 and the high-side driver 110. If the power supply voltage provided to the high-side driver 108 and the high-side driver 110 through LBOOT drops due to the current required to charge the gate-to-drain capacitance of the switch 104, then the slew rate of voltage across the high-side transistor 102 is decreased, and the efficiency of the power stage circuit 100 is decreased.

Partitioning the high-side transistor 102 into the switch 104 and the switch 106 reduces the gate-to-drain capacitance driven by the high-side driver 108, which reduces the voltage dropped across the parasitic capacitance LBOOT, and reduces dip in the drive voltage provided to the high-side transistor 102, which increases the switching speed of the switch 104. The ratio of the transistor cells of the high-side transistor 102 allocated to the switch 104 and the switch 106 may be selected to optimize the efficiency of the power stage circuit 100. In one implementation of the power stage circuit 100, the transistor cells of the high-side transistor 102 may be divided equally between the switch 104 and the switch 106 (50% of the cells on the high-side transistor 102 allocated to each of the switch 104 and the switch 106. In another implementation of the power stage circuit 100, approximately ⅓ of the transistor cells of the high-side transistor 102 may be allocated to the switch 104, and ⅔ of the transistor cells of the high-side transistor 102 may be allocated to the switch 106. In another implementation of the power stage circuit 100, approximately ¼ of the transistor cells of the high-side transistor 102 may be allocated to the switch 104, and ¾ of the transistor cells of the high-side transistor 102 may be allocated to the switch 106. Other implementations of the power stage circuit 100 may allocate the transistor cells of the high-side transistor 102 to the switch 104 and the switch 106 according to a different ratio.

To improve efficiency across a range of load currents, some implementations of the power stage circuit 100 may dynamically allocate the transistor cells of the high-side transistor 102 to the switch 104 and the switch 106 based on the load current drawn from the power stage circuit 100. For example, a higher load current may allocate fewer transistor cells to the switch 104 and more transistor cells to the switch 106, while a lower load current may allocate more transistor cells to the switch 104 and fewer transistor cells to the switch 106.

In some examples of the power stage circuit 100, the delay circuit 112 may be implemented to provide a fixed delay (e.g., 5-10 nanoseconds), where the delay applied to the high-side drive signal HDRV is selected to close the switch 106 after the switch 104 is closed and the voltage across the high-side transistor 102 has dropped to less than a predetermined voltage (e.g., a few millivolts). The delay is sufficient to allow the voltage across the high-side transistor 102 to drop to less than the predetermined voltage. In other examples of the power stage circuit 100, the delay circuit 112 includes an input coupled to the switch node, and the delay circuit 112 provides a delay based on the voltage at the switch node.

Figure 2:
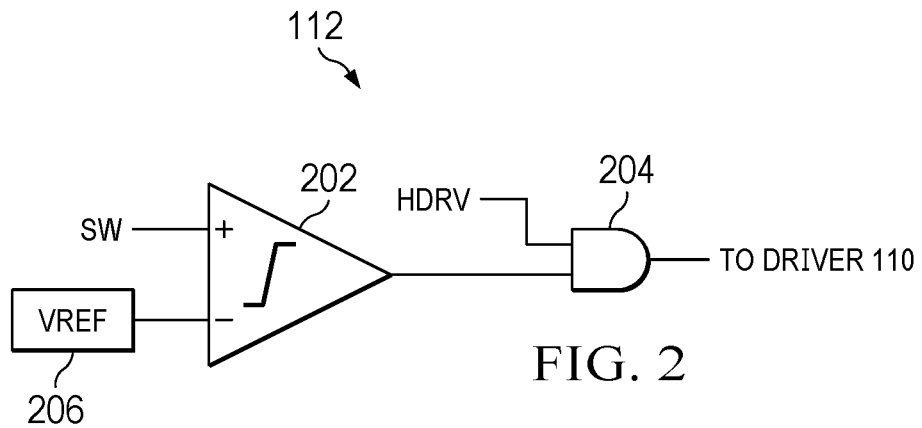
FIG. 2 is a block diagram of a delay circuit suitable for sequencing the partitioned transistor in the power stage circuit of FIG. 1, in an example.

FIG. 2 is a block diagram of an example delay circuit 112 that delays the high-side drive signal based on the voltage at the switch node. The delay circuit 112 includes a comparator 202 and a logic gate 204. The comparator 202 has a first input (a comparator input) coupled to the switch node and a second input coupled to a reference voltage circuit 206. The comparator 202 compares the voltage at the switch node to the reference voltage provided by the reference voltage circuit 206. The output (comparator output) of the comparator 202 is coupled to a first input (a gate input) of the logic gate 204. A second input of the logic gate 204 is coupled to the HDRV output of the PWM circuit 118 (the input of the high-side driver 108). An output (gate output) of the logic gate 204 is coupled to the input of the high-side driver 110. When HDRV is a logic high to turn on the high-side transistor 102, the switch 104 has been closed, and the voltage at the switch node increases and exceeds the reference voltage, the output of the comparator 202 goes high and the logic gate 204 passes HDRV to the high-side driver 110 to close the switch 106. Accordingly, the delay provided by the delay circuit 112 is variable, and based on the voltage at the switch node.

Figure 3:
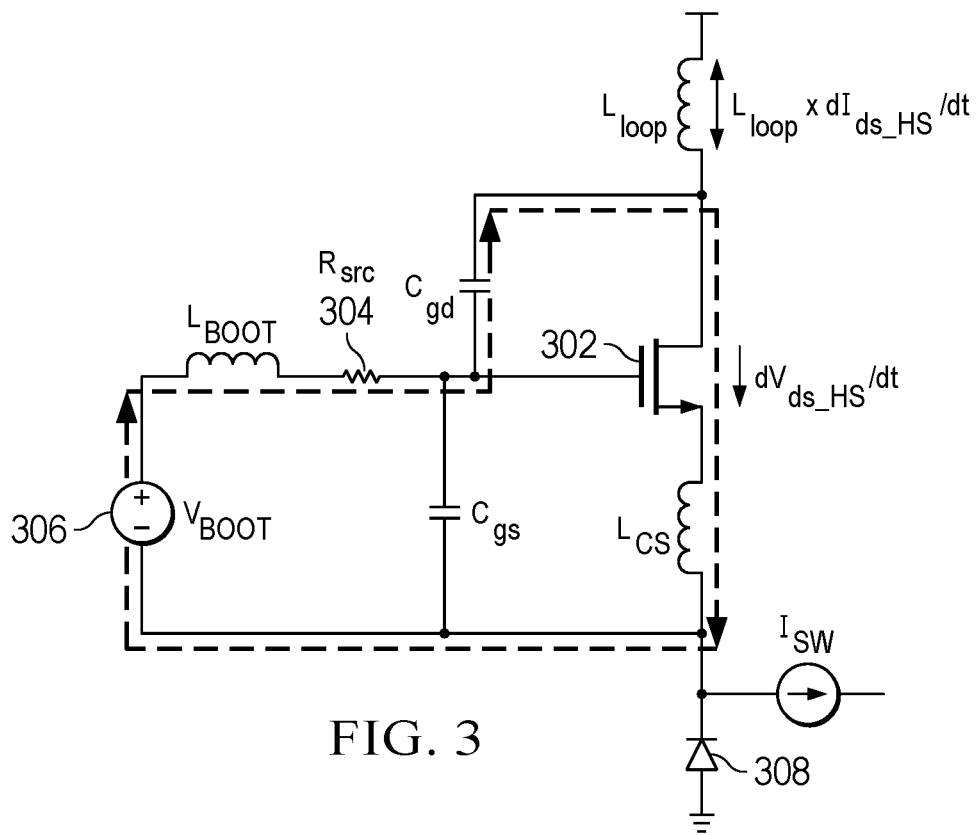
FIG. 3 is schematic of a circuit suitable for describing high-side switching in the power stage of FIG. 1, in an example.

FIG. 3 is schematic of a high-side transistor circuit useful for describing high-side switching in the power stage circuit 100. In FIG. 3, the transistor 302 represents the high-side transistor 102, the resistor 304 represents the output resistance (Rsrc) of the driver (e.g., the high-side driver 108), the voltage source 306 represents the boot voltage circuit 126, and the diode 308 represents the low-side transistor 114. FIG. 3 also shows the gate-to-drain capacitance Cgd and the gate-to-source capacitance Cgs of the transistor 302, and the parasitic inductances $L_{BOOT}$, $L_{loop}$, and $L_{CS}$.

For a high current converter, the parasitic inductance $L_{loop}$ should be minimized. With $L_{loop}$ minimized, overlap loss when turning on the transistor 302 is dominant. To minimize overlap loss, the transistor 302 should be turned on with fast $$\frac{dV_{ds\_HS}}{dt},$$

because $$\frac{dI_{ds\_HS}}{dt}$$

is fast with a small value of $L_{loop}$. If the transistor 302 has a large gate-to-drain capacitance (Cgd), then a fast changing gate current $$I_g = C_{gd} * \frac{dV_{ds\_HS}}{dt}$$

is needed to meet the $$\frac{dV_{ds\_HS}}{dt}$$

target, which requires urat driver output resistance Rsrc be very small. However, because $$\frac{dI_{ds\_HS}}{dt}$$

is limited by $L_{BOOT}$, Ib may be unable to reach the target $$I_g = C_{gd} * \frac{dV_{ds\_HS}}{dt}$$

when the voltage Vds across the transistor 302 begins to fall.

By partitioning the high-side transistor into multiple switches, as in the power stage circuit 100, the gate-to-drain capacitance to be charged is reduced, which reduces the current Ig needed to achieve the target $$\frac{dV_{ds\_HS}}{dt}.$$

With the high-side transistor partitioned into two switches, the power stage circuit 100 minimizes conduction loss by setting the delay provided by the delay circuit 112 to close the second switch as soon as the voltage at the switch node is close to VIN.

Figure 4:
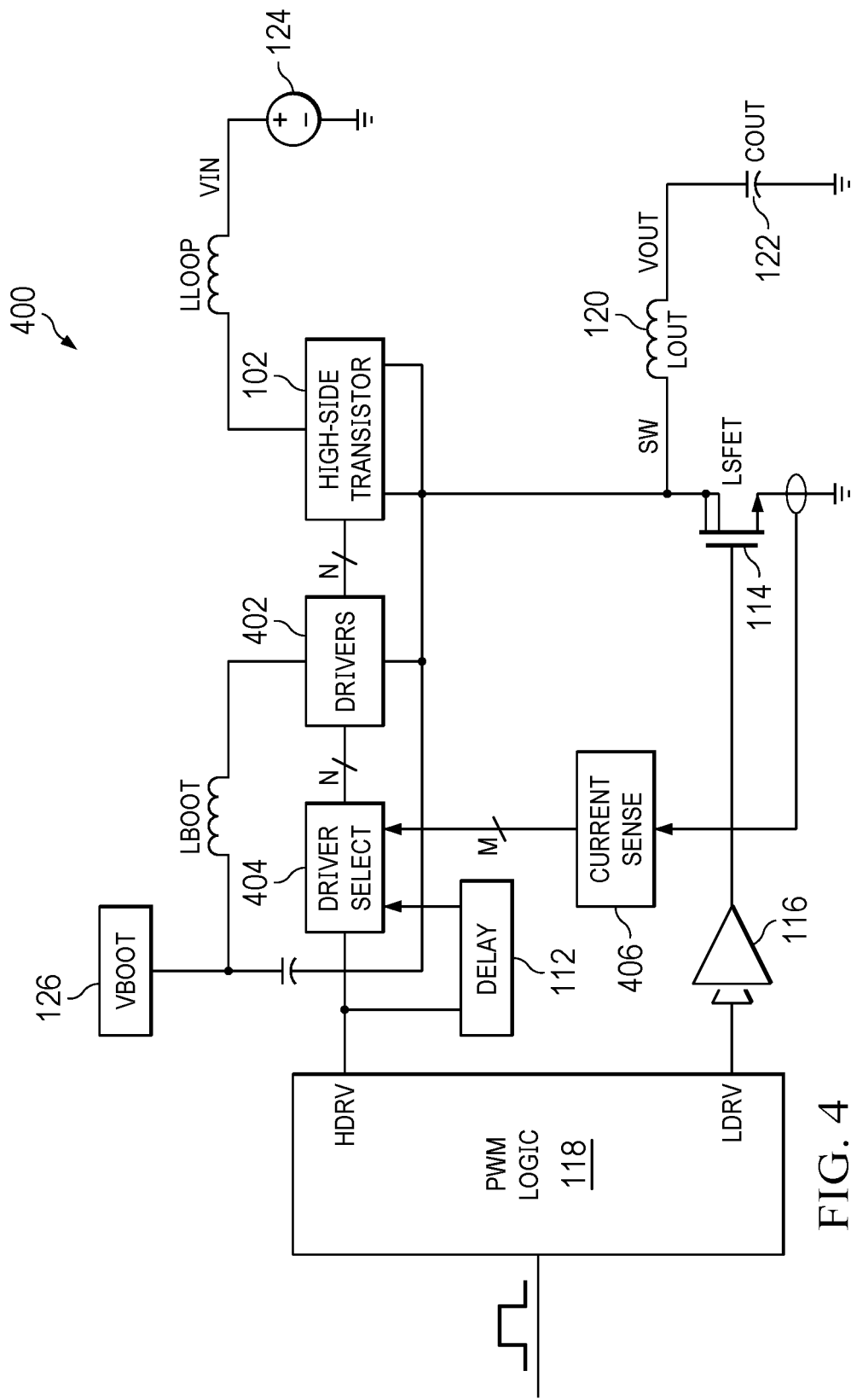
FIG. 4 is a block diagram of a power stage circuit that includes dynamic transistor partitioning based on load current as described herein, in an example.

FIG. 4 is a block diagram of power stage circuit 400 that includes dynamic transistor partitioning based on load current. In the power stage circuit 400, the high-side transistor 102 is divided into multiple sections, each section including a portion of the transistor cells. Allocation of the sections of the high-side transistor 102 to the switch 104 and the switch 106 is based on the load current drawn from the power stage circuit 400. For example, to optimize efficiency fewer sections of the high-side transistor 102 may be allocated to the switch 104 when load current is low, and more sections of the high-side transistor 102 may be allocated to the switch 104 when load current is high. The power stage circuit 400 includes the high-side transistor 102, the delay circuit 112, the low-side transistor 114, and the low-side driver 116 as described with regard to the power stage circuit 100. The power stage circuit 400 also includes drivers 402 and a driver select circuit 404.

The drivers 402 includes a driver (e.g., an instance of the high-side driver 108 shown in FIG. 1) for each section of the high-side transistor 102. If the high-side transistor 102 is subdivided into eight sections, then the drivers 402 may include eight drivers, where an output of each of the drivers is coupled to a control input of one of the sections of the high-side transistor 102. The input of each of the drivers is coupled to an output of the driver select circuit 404 (e.g., each driver input is coupled to a different output of the driver select circuit 404).

The driver select circuit 404 selects the HDRV signal received from the PWM circuit 118 or the delayed HDRV signal received from the delay circuit 112 to provide to each driver of the drivers 402. Selection of HDRV or delayed HDRV is based on a load current value received from a current sense circuit 406. The current sense circuit 406 senses the load current drawn from the power stage circuit 100 and generates the load current value provided to the driver select circuit 404. The load current value is representative of the sensed current and may be a multi-bit digital value. For example, the load current value may be a three-bit value if the current sense circuit 406 categorizes the sensed current in eight ranges. The current sense circuit 406 may include comparators and encoding circuitry to determine the range of sensed current and generate the load current value.

Table 1 below is an example of selection of the drive signals provided by the driver select circuit 404 with eight drivers and a three-bit load current value. In Table 1, columns D1-D7 represent the eight drivers of the drivers 402, HDRV is the drive signal provided by the PWM circuit 118, and DHDRV is the delayed version of HDRV provided by the delay circuit 112.

TABLE 1

| Load Current Value | D1 | D2 | D3 | D4 | D5 | D6 | D7 | D8 |
|---|---|---|---|---|---|---|---|---|
| 0 | HDRV | DHDRV | DHDRV | DHDRV | DHDRV | DHDRV | DHDRV | DHDRV |
| 1 | HDRV | HDRV | DHDRV | DHDRV | DHDRV | DHDRV | DHDRV | DHDRV |
| 2 | HDRV | HDRV | HDRV | DHDRV | DHDRV | DHDRV | DHDRV | DHDRV |
| 3 | HDRV | HDRV | HDRV | HDRV | DHDRV | DHDRV | DHDRV | DHDRV |
| 4 | HDRV | HDRV | HDRV | HDRV | HDRV | DHDRV | DHDRV | DHDRV |
| 5 | HDRV | HDRV | HDRV | HDRV | HDRV | HDRV | DHDRV | DHDRV |
| 6 | HDRV | HDRV | HDRV | HDRV | HDRV | HDRV | HDRV | DHDRV |
| 7 | HDRV | HDRV | HDRV | HDRV | HDRV | HDRV | HDRV | HDRV |

In the example of Table 1, for a load current value of zero, the switch 104 includes one section (⅛th) of the transistor cells of the high-side transistor 102, and the switch 106 includes seven sections (⅞ths) of the transistor cells of the high-side transistor 102. For a load current value of one, the switch 104 includes two sections (¼th) of the transistor cells of the high-side transistor 102, and the switch 106 includes six sections (¾ths) of the transistor cells of the high-side transistor 102. By dynamically changing the allocation of transistor cells assigned to the switch 104 and the switch 106 based on the load current, the power stage circuit 400 can provide improved efficiency over a wide range of load currents. While an example using eight load current ranges and eight transistor sections has been used to describe operation of the power stage circuit 400, some implementations of the power stage circuit 400 may use a different number of transistor sections and/or load current ranges.

Figure 5:
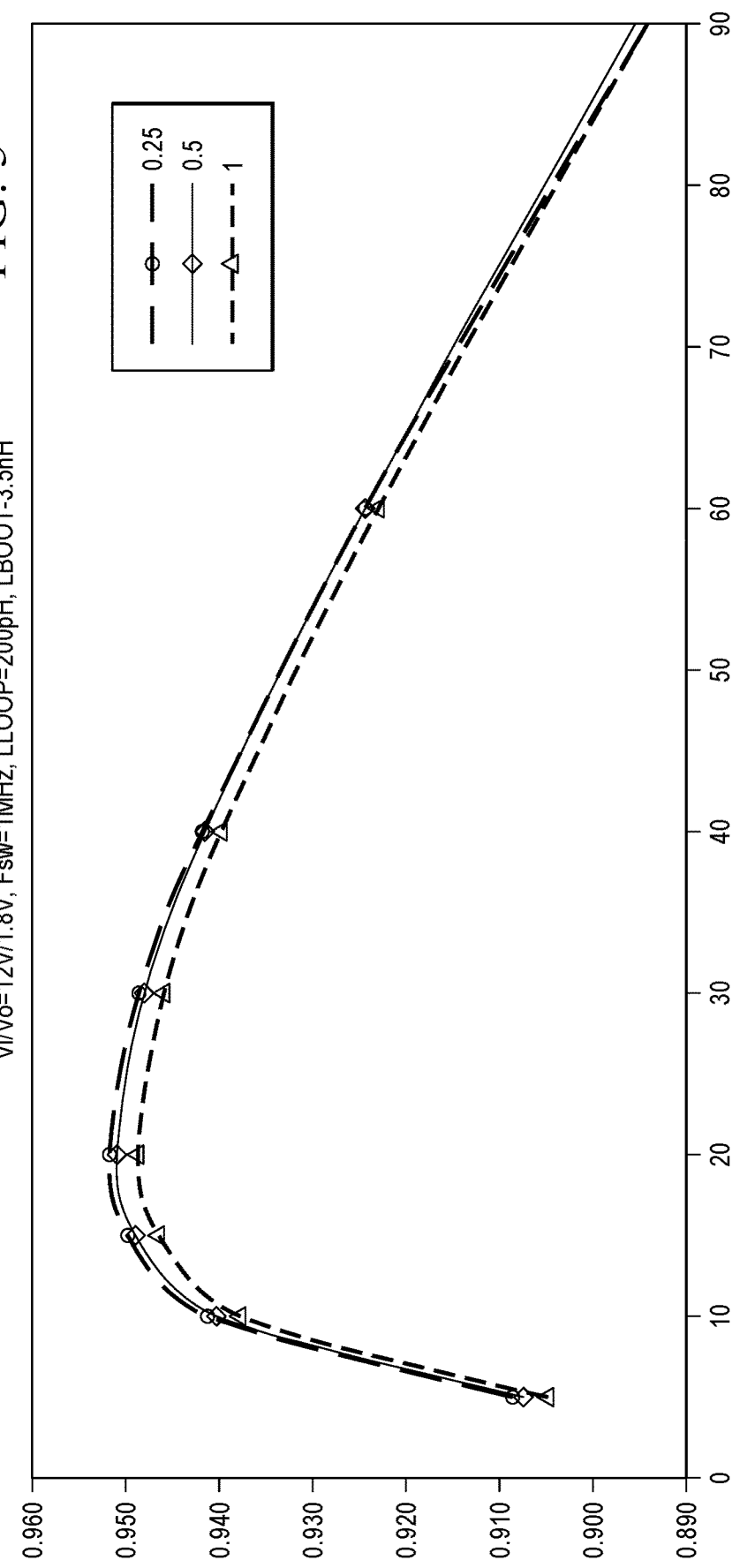
FIG. 5 is a graph of efficiency of the power stage of FIG. 1 or FIG. 4 with various ratios used to partition the high-side transistor, in an example.

FIG. 5 is a graph of efficiency of the power stage circuit 100 or the power stage circuit 400 with the high-side transistor 102 partitioned using different ratios. In FIG. 4, VIN is 12 volts, VOUT is 1.8 volts, the switching frequency is 1 Megahertz, Lloop is 200 picohenries (pH), and Lboot is 3.5 pH. The partitioning ratios (K) illustrated are 0.25, 0.5 and 1. For K=0.25, 25% of the transistor cells of the high-side transistor 102 are allocated to the switch 104, and 75% of the transistor cells of the high-side transistor 102 are allocated to the switch 106. For K=0.5, half of the transistor cells of the high-side transistor 102 are allocated to each of the switch 104 and the switch 106. For K=1, all of the transistor cells of the high-side transistor 102 are allocated to the switch 104, and the switch 106 is not used. FIG. 5 shows that over the illustrated range of load currents, K=0.25 and K=0.5 generally provide higher efficiency than K=1. The efficiency gains are higher with lighter loads where overlap loss is dominant.

Figure 6:
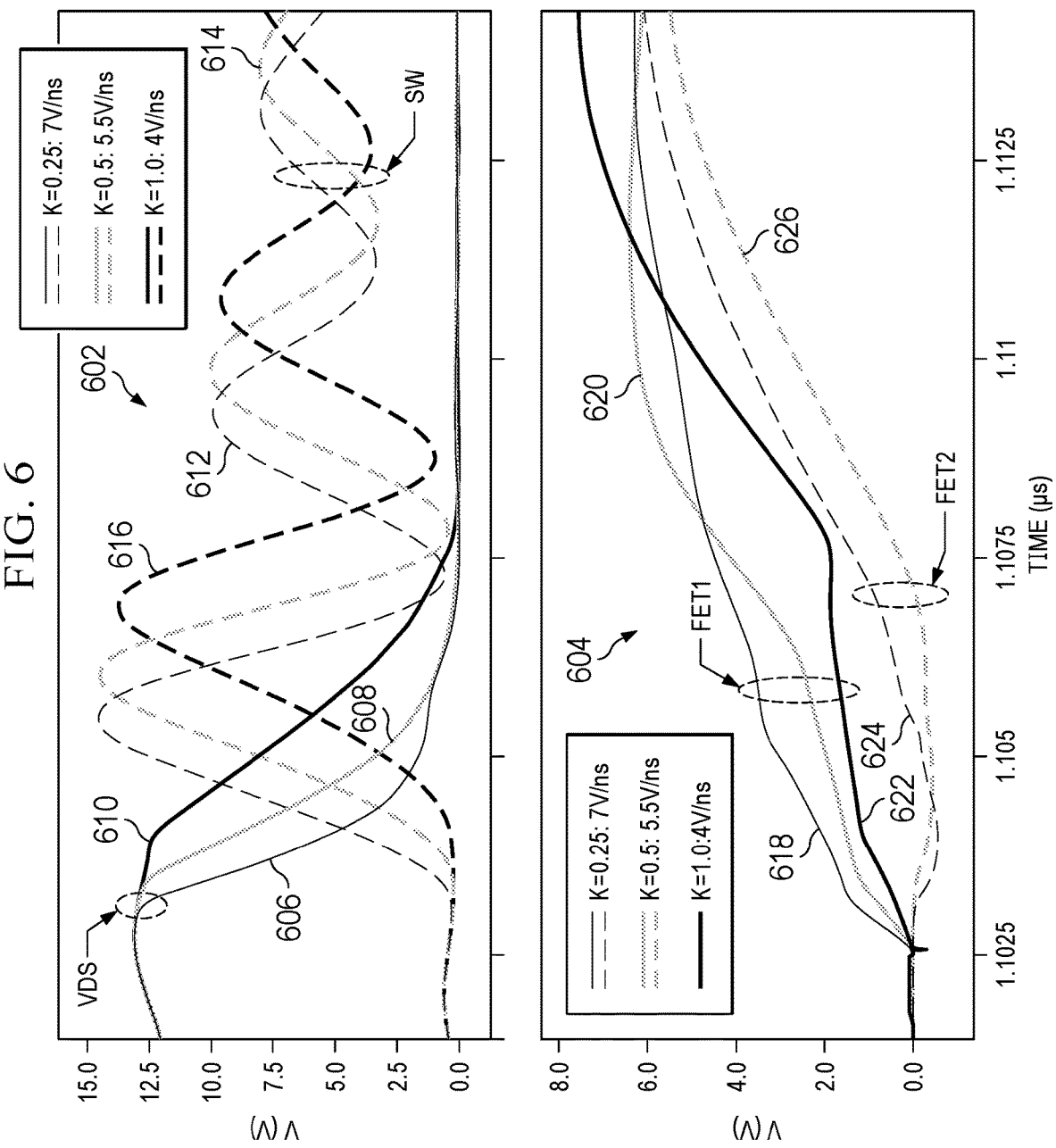
FIG. 6 is a graph of signals in the power stage circuit of FIG. 1 or FIG. 4 using various ratios to partition in the high-side transistor, in an example.

FIG. 6 is a graph of signals in the power stage circuit 100 or the power stage circuit 400 with the high-side transistor 102 partitioned using various ratios. FIG. 6 includes a graph 602 and a graph 604. The graph 602 shows voltage across the high-side transistor 102 (Vds) and switch node voltage. The graph 604 shows gate-to-source voltage (Vgs) of the switch 104 and the switch 106. Each of the voltages is provided for ratios K=0.25, K=0.5, and K=1. The output resistance of the high-side driver 108 and the high-side driver 110 is same for all of the graphed signals. In the graph 602, the signals 606, 608 and 610 represent the voltage across the high-side transistor 102 with K equal to 0.25, 0.5 and 1, respectively. The signals 612, 614, and 616 represent the voltage at the switch node with K equal to 0.25, 0.5 and 1, respectively. With K=0.25, when the high-side transistor 102 is closed, the voltage across the high-side transistor 102 changes at a rate of about 7 volts/nanosecond (V/ns). With K=0.5, the voltage across the high-side transistor 102 changes at a rate of about 5.5 V/ns. With K=1, the voltage across the high-side transistor 102 changes at a rate of about 4 V/ns.

In the graph 604, the gate-to-source voltage of the switch 104 with K=0.25 increases more quickly than with K=0.5 or 1, and the gate-to-source voltage of the switch 104 with K=0.5 increases more quickly than with K=1. After the voltage across the high-side transistor 102 has dropped (e.g., the voltage at the switch node has risen to VIN), the high-side driver 110 drives the switch 106, and the gate-to-source voltage of the switch 106 increases to close the switch 106.

Figure 7:
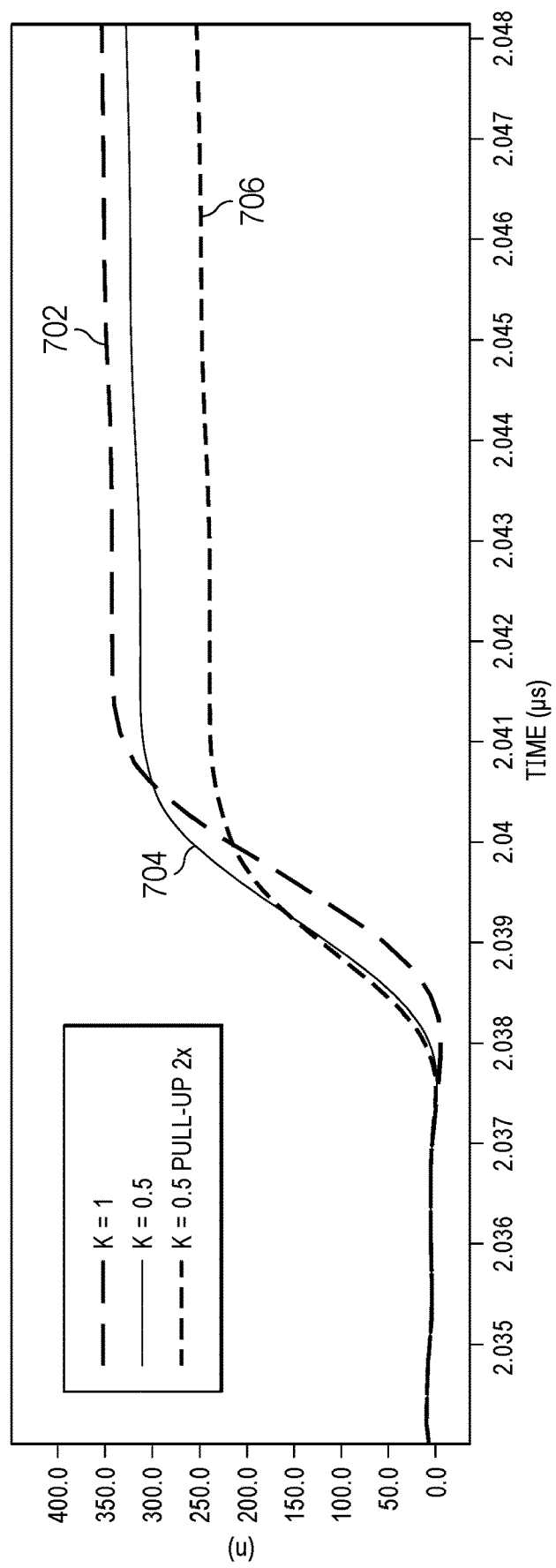
FIG. 7 is a graph of overlap losses in the power stage circuit of FIG. 1 or FIG. 4 with various ratios of partitioning of the high-side transistor, in an example.

FIG. 7 is a graph of overlap losses in the power stage circuit 100 or the power stage circuit 400 with the high-side transistor 102 partitioned using different ratios and with different strengths of driver pull up. FIG. 7 shows overlap loss is reduced with K=0.5 (graph 702) relative to K=1 (graph 704), and with the pull-up strength of the high-side driver 108 doubled (graph 706) the overlap loss is further reduced.

Figure 8:
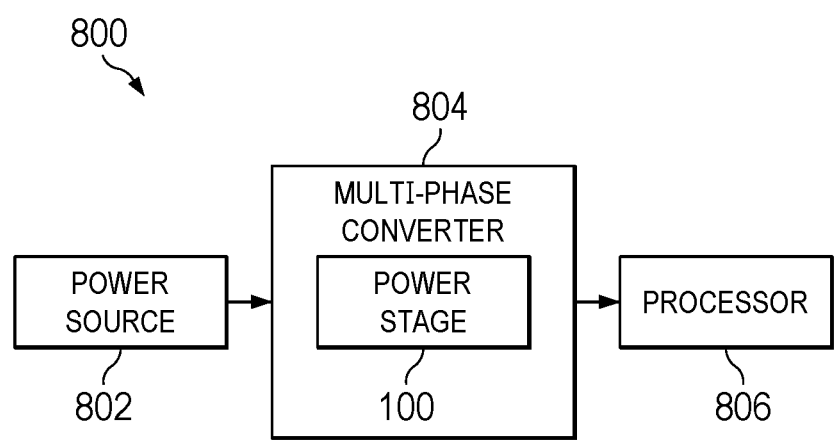
FIG. 8 is a block diagram of a processor circuit that includes the power stage circuit of FIG. 1 or FIG. 4, in an example.

FIG. 8 is a block diagram of a processor circuit 800 that includes the power stage circuit 100 or the power stage circuit 400. The processor circuit 800 includes a power source 802, a multi-phase DC-DC converter 804, and a processor 806. The power source 802 may be a battery, an AC-DC power supply, or other DC voltage source. The multi-phase DC-DC converter 804 is coupled to the 802. An output of the multi-phase DC-DC converter 804 is coupled to the processor 806. The multi-phase DC-DC converter 804 generates an output voltage that is provided to the processor 806. The processor 806 may be a general-purpose microprocessor, a graphics processor, a digital signal processor, or any other digital processing circuit. The multi-phase DC-DC converter 804 includes the power stage circuit 100 (or the power stage circuit 400) to improve the efficiency of the multi-phase DC-DC converter 804.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring May be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A circuit comprising:
   a transistor partitioned into a first switch and a second switch, the first switch having a first control terminal and the second switch having a second control terminal;
   a first driver having an input and an output, the output coupled to the first control terminal; and
   a second driver having an input and an output, the output coupled to the second control terminal;
   a delay circuit having an output;
   a driver select circuit having a first input, a second input, a first output, and a second output, the first input coupled to the output of the delay circuit, the first output coupled to the first control terminal, and the second output coupled to the second control terminal; and
   a current sense circuit having an output coupled to the second input of the driver select circuit.

2. The circuit of claim 1, wherein the delay circuit includes a logic gate having:
   a first input coupled to the input of the first driver;
   a second input coupled to a current terminal of the transistor; and
   an output coupled to the input of the second driver.

3. The circuit of claim 2, wherein the delay circuit includes a comparator having:
   a first input coupled to the current terminal of the transistor;
   a second input coupled to a reference voltage circuit; and
   an output coupled to the second input of the logic gate.

4. The circuit of claim 1, wherein:
   the delay circuit is coupled between a current terminal of the transistor and the input of the second driver; and
   the delay circuit is configured to delay closure of the second switch based on a voltage at the current terminal.

5. The circuit of claim 1, wherein:
the first switch includes a first current terminal and a second current terminal; and
the delay circuit is configured to delay turn-on of the second switch for a time sufficient to allow a voltage at the second current terminal to approximately equal a voltage at the first current terminal.

6. The circuit of claim 1, wherein transistor cells of the transistor are equally divided between the first switch and the second switch.

7. The circuit of claim 1, wherein one-third of transistor cells of the transistor are allocated to the first switch and two-thirds of the transistor cells are allocated to the second switch.

8. A circuit comprising:
a transistor including an array of transistor cells partitioned into a first switch and a second switch, wherein the transistor cells are dynamically allocated to the first switch and the second switch;
a first driver configured to control the first switch;
a second driver configured to control the second switch; and
a delay circuit coupled between an input of the first driver and an input of the second driver.

9. The circuit of claim 8, wherein the transistor cells are equally divided between the first switch and the second switch.

10. The circuit of claim 8, wherein one-third of the transistor cells are allocated to the first switch and two-thirds of the transistor cells are allocated to the second switch.

11. The circuit of claim 8, wherein the delay circuit includes a comparator configured to compare a voltage at a current terminal of the first switch to a reference voltage.

12. The circuit of claim 11, wherein the delay circuit is configured to enable the second driver to close the second switch responsive to the voltage at the current terminal of the first switch being greater than the reference voltage.

13. The circuit of claim 8 wherein:
first switch includes a first current terminal and a second current terminal; and
the second switch includes:
a first current terminal coupled to the first current terminal of the first switch; and
a second current terminal coupled to the second current terminal of the second switch.

14. A switching converter comprising:
a first transistor partitioned into a first switch and a second switch, the first switch having a first control terminal and a first current terminal, and the second switch having a second control terminal and a second current terminal;
a second transistor including a control terminal, and a first current terminal, and a second current terminal, the first current terminal coupled to the first current terminal of the first transistor and the second current terminal of the first switch;
a first driver having an input and an output, the output coupled to the first control terminal of the first transistor;
a second driver having an input and an output, the output coupled to the second control terminal of the first transistor;
a third driver having an output coupled to the control terminal of the second transistor; and
a delay circuit having an input and an output, the input coupled to the input of the first driver and the output coupled to the input of the second driver, the delay circuit comprising:
a comparator having an input and an output, the input coupled to the first current terminal of the second transistor, wherein a second input of the comparator is configured to receive a reference voltage; and
a logic gate having a first input, a second input, and an output, the first input configured to receive a pulse width modulation (PWM) signal, the second input coupled to the output of the comparator, and the output is coupled to the output of the delay circuit.

15. The switching converter of claim 14, wherein transistor cells of the first transistor are equally divided between the first switch and the second switch.

16. The switching converter of claim 14, wherein one-third of transistor cells of the first transistor are allocated to the first switch and two-thirds of the transistor cells are allocated to the second switch.

17. The switching converter of claim 14, wherein:
the delay circuit is coupled between the first current terminal of the first transistor and the input of the second driver; and
the delay circuit is configured to delay closure of the second switch based on a voltage at the second current terminal of the first transistor.

18. The switching converter of claim 14, wherein:
the first switch includes a current terminal; and
the delay circuit is configured to delay turn-on of the second switch for a time sufficient to allow a voltage at the first current terminal of the first transistor to approximately equal a voltage at the current terminal of the first switch.

19. The switching converter of claim 14, wherein the logic gate is an AND gate.

* * * * *